United States Patent
Kiesewetter et al.

(10) Patent No.: US 7,579,849 B2
(45) Date of Patent: Aug. 25, 2009

(54) PROBE HOLDER FOR A PROBE FOR TESTING SEMICONDUCTOR COMPONENTS

(75) Inventors: Jorg Kiesewetter, Thiendorf (DE); Stefan Kreissig, Venusberg (DE); Stojan Kanev, Sacka (DE)

(73) Assignee: SUSS MicroTec Test Systems GmbH, Sacka (DE)

( * ) Notice: Subject to any disclaimer, the term of this patent is extended or adjusted under 35 U.S.C. 154(b) by 0 days.

(21) Appl. No.: 11/674,430

(22) Filed: Feb. 13, 2007

(65) Prior Publication Data

US 2008/0122468 A1    May 29, 2008

(30) Foreign Application Priority Data

Nov. 29, 2006  (DE) ................ 10 2006 056 646

(51) Int. Cl.
   *G01R 31/02*    (2006.01)
(52) U.S. Cl. ............................... 324/754
(58) Field of Classification Search ............ 324/754, 324/757

See application file for complete search history.

(56) References Cited

U.S. PATENT DOCUMENTS

| | | | | | |
|---|---|---|---|---|---|
| 4,034,293 | A | * | 7/1977 | Roch | 324/762 |
| 4,123,706 | A | * | 10/1978 | Roch | 324/754 |
| 5,314,825 | A | * | 5/1994 | Weyrauch et al. | 436/43 |
| 5,334,931 | A | * | 8/1994 | Clarke et al. | 324/757 |
| 5,489,855 | A | * | 2/1996 | Poisel | 324/762 |
| 7,190,182 | B2 | * | 3/2007 | Romanov | 324/754 |

* cited by examiner

*Primary Examiner*—Jermele M Hollington
(74) *Attorney, Agent, or Firm*—Heslin Rothenberg Farley & Mesiti P.C.; Victor A. Cardona, Esq.

(57) ABSTRACT

A probe holder in which the probe needle has a slight horizontal offset under the action of a vertical force, includes a probe holder for a probe needle, wherein the holder is adapted, for fastening and electrical contact-connection, on a carrier device of a test apparatus and has a holder arm having a needle holder at the free end thereof to fasten the probe needle, and a fastening arm for connecting the probe holder to the carrier device. The holder arm and the fastening arm are connected to one another by an articulated joint, whereby horizontal offset of the needle tip on account of external forces can be reduced or even prevented by increasing the radius of the yielding movement of the probe needle.

11 Claims, 1 Drawing Sheet

PROBE HOLDER FOR A PROBE FOR TESTING SEMICONDUCTOR COMPONENTS

BACKGROUND ART

Figure 1:
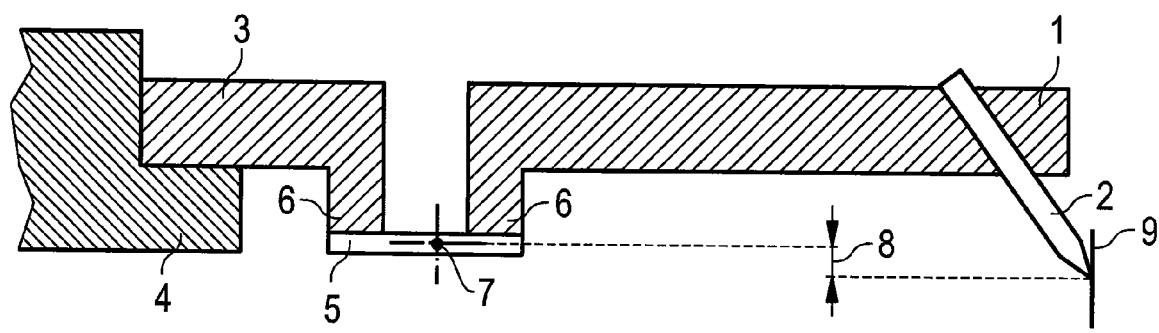

The invention relates to a probe holder for a probe.

In order to test the functionality of semiconductor components, the semiconductor components, which are usually still combined with other semiconductor components and are arranged on a wafer at this point in time, are placed and fastened in a test apparatus, which is provided for this purpose, on a movable test table (chuck). The semiconductor component is then contact-connected using a probe so that measurements can be carried out. The probe, which is in the form of a needle and is also referred to as a probe tip, is usually fastened to a carrier device, for example a carrier plate (probe card) or a probe holder arm (probe arm), in such a manner that it is arranged obliquely with respect to the surface of the semiconductor component. That part which connects the probe needle to the carrier device is uniformly referred to below as a probe holder. The present invention relates to an improved probe holder of this type.

In order to establish electrical contact between the probe needle and the semiconductor component to be tested (device under test, DUT), the probe needle is positioned above the semiconductor component and is brought into contact with a contact area, for example a bonding island of the semiconductor component, by lowering the probe holder. The force which acts on the probe needle in the vertical direction in this case results in deformation of the probe holder or/and of the probe needle or, if the probe needle is not rigidly clamped in, in rotation of the probe needle about a horizontal axis. The resulting displacement of the tip of the probe needle in the horizontal direction (horizontal offset) results in inaccuracies, which are difficult to control, when positioning the probe needle during the test and measurement operations.

On the basis of this prior art, the object of the present invention is to specify a probe holder which overcomes the disadvantages of the prior art and in which, in particular, the probe needle has a smaller horizontal offset under the action of a vertical force.

SUMMARY OF THE INVENTION

The inventive probe holder for a probe needle, which, for fastening and electrical contact-connection, is formed on a carrier device of a test apparatus and has a holder arm having a needle holder which is arranged at the free end of the holder arm and is intended to fasten the probe needle, is distinguished by the fact that provision is also made of a fastening arm for connecting the probe holder to the carrier device, and by the fact that the holder arm and the fastening arm are connected to one another by means of an articulated joint.

The basic concept of the invention is based on the consideration that the horizontal offset of the needle tip on account of external forces can be reduced or even prevented by increasing the radius of the yielding movement of the probe needle on the basis of rotation of the probe needle relative to the holder arm or on the basis of flexural deformation of the holder arm such that the curvature of the path, along which the tip of the probe needle moves during this yielding movement, is reduced. A reduction in the curvature of the path reduces the ratio of the horizontal component to the vertical component of the yielding movement, that is to say the horizontal offset becomes smaller for a given vertical displacement of the tip of the probe needle.

According to the invention, this is achieved by virtue of the fact that the holder arm which carries the probe needle is mounted in an articulated manner on that end which is opposite the needle holder. The articulated joint used for this purpose likewise itself requires a mount which is provided by the fastening arm. At its free end, that is to say that end which is opposite the needle holder, the fastening arm itself is designed to be connected and contact-connected to the carrier device of a test apparatus. It goes without saying that, in order to achieve the aim of the invention in the best possible manner, the holder arm should be designed to be as long as possible in order to achieve the greatest possible radius for the yielding movement of the probe needle. Since the available space for installing the probe holder in a test apparatus is generally limited, a person skilled in the art, when implementing the invention, will make the fastening arm as short as possible in the holder arm's favor.

When installed inside a test apparatus for testing semiconductor components, the probe holder will usually be arranged horizontally or obliquely above the semiconductor component which is to be tested and is usually arranged horizontally. Insofar as the terms "horizontal" and "vertical" are used below, they relate to the normal installation of the probe holder in a test apparatus of the type just described.

In the sense of this application, an articulated joint is intended to be understood as meaning a component which can be fitted between the carrier arm and the fastening arm and, when an external vertical force acts on the tip of the probe needle, gives rise to a pivoting movement of the holder arm about this component, that is to say a purely rotational movement of the holder arm and of the probe needle, which is fitted to the latter, without a translatory component. Articulated joints of this type may be configured in various ways without departing from the basic concept of the invention. For example, the articulated joint could be designed in such a manner that the holder arm has at least one pin which is arranged horizontally and transversely with respect to the holder arm and is rotatably mounted in a sliding bearing eye that is provided on the fastening arm. However, on account of the small dimensions of the parts of the probe holder, such a solution would presumably be relatively complicated to produce and would therefore be costly. Some advantageous refinements of the concept of the invention are explained below.

In one refinement of the invention, the articulated joint comprises at least one flexurally soft solid, one end of which is connected to the holder arm and the other end of which is connected to the fastening arm. In the sense of the invention, flexurally soft is intended to mean that the solid has a lower flexural rigidity EI than the holder arm relative to a horizontal bending axis which runs transversely to the longitudinal direction of the holder arm. This means that either the modulus of elasticity E or the planar moment of inertia I (also referred to as the second moment of plane area) or both is/are lower than the corresponding values for the holder arm. The decisive factor is that the product of E and I for the solid is smaller than for the holder arm.

In this sense, a flexurally soft solid could be, for example, a relatively short connecting element which is arranged between the holder arm and the fastening arm and comprises an elastomer or another relatively soft polymer whose cross section corresponds to that of the holder arm and fastening arm. In this case, the modulus of elasticity E of the solid would be lower than that of the holder arm, while both have the same planar moment of inertia, with the result that the flexural rigidity EI of the solid is lower than that of the holder arm.

Alternatively, provision may be made for the articulated joint to comprise at least one elongate connecting element, one end of which is connected to the holder arm and the other end of which is connected to the fastening arm. The elongate connecting element could be, for example, a metal strip which is rigidly connected, by a respective one of its two ends, to the holder arm and to the fastening arm. In this case, the planar moment of inertia I of the connecting element is lower than that of the holder arm, while the modulus of elasticity E is equal to or greater than that of the holder arm. In any case, it must be ensured that the flexural rigidity of the elongate connecting element, that is to say the product of the modulus of elasticity and the planar moment of inertia, is lower than the flexural rigidity of the holder arm.

This refinement, as well as the above-described refinement with a flexurally soft solid, provides an articulated joint which simultaneously has the property of producing a restoring force when the articulated joint is displaced from its neutral position.

In contrast, for joints which do not have this property, it is advantageous to provide for at least one spring element for generating a restoring force to also be arranged on the articulated joint. Such a spring element could be, for example, a helical spring comprising spring steel or else an elastic thread which is clamped between the holder arm and the fastening arm.

One advantageous development of the invention provides for the articulated joint to be arranged beneath the holder arm and the fastening arm. The probe needle is usually arranged on the holder arm in such a manner that its tip ends beneath the holder arm in the normal installation position in the test apparatus. In order to keep the horizontal offset of the probe needle on account of a vertical force as small as possible, an attempt must be made to design the course of the path of the yielding movement in such a manner that the tangent to the course of the path is as steep as possible, that is to say differs from the vertical to the least possible extent. According to the development, this is achieved by virtue of the fact that the articulated joint is displaced from the height level of the holder arm in the direction of the tip of the probe needle.

By way of example, provision may be made for the articulated joint to be arranged at a vertical distance from the holder arm, which vertical distance may correspond approximately to the vertical distance between the tip of the probe needle and the holder arm in one advantageous refinement. In this case, the tangent to the movement path is aligned in an exactly vertical manner at the location of the tip of the probe needle at the beginning of the yielding movement. However, it must be taken into account that the articulated joint must not collide with the semiconductor component to be tested or with the wafer containing the semiconductor component.

When the articulated joint is at least partially produced from a polymer, it is advantageous to provide for the polymer to be electrically conductive. This makes it possible to pass test signals from the carrier device to the probe needle via the fastening arm, the articulated joint and the holder arm. In order to achieve the electrical conductivity, graphite, for example, can be added to the polymer.

One particularly advantageous refinement may provide for the articulated joint to have electrically conductive paths. If graphite is added to the polymer for this purpose, it must be ensured that there are areas containing graphite which are separated from other areas containing graphite by means of graphite-free areas. The provision of conductive paths which may, of course, also be produced in another way, for example by embedding metal threads in the polymer, makes it possible to pass test signals to the probe needle on a plurality of conductor tracks.

It goes without saying that the object of the invention is also achieved by means of a test apparatus for testing semiconductor components, said test apparatus having a probe holder of the type described above.

BRIEF DESCRIPTION OF THE DRAWING FIGURE

The invention will be explained in more detail below with reference to an exemplary embodiment and an associated drawing. In this case, the single FIG. 1 shows an inventive probe holder.

DETAILED DESCRIPTION

The probe holder illustrated comprises a holder arm 1, which has a needle holder in which a probe needle 2 is fastened, and a fastening arm 3 which is designed for fastening and for establishing electrical contact to a carrier device 4 and, in the exemplary embodiment, is also connected to the carrier device 4. The holder arm 1 and the fastening arm 3 are connected to one another by means of an articulated joint which, in the exemplary embodiment, comprises two elongate connecting elements 5 which are arranged parallel to one another at the same height and are rigidly connected to a respective section of the fastening arm 3 and of the holder arm 1, said section being in the form of a cantilever arm 6. Only the first of the two connecting elements 5 can be seen in the selected illustration; the second connecting element is concealed by the first connecting element 5. The cantilever arms 6 extend downward from the horizontally arranged sections of the fastening arm 3 and of the holder arm 1 as far as the vicinity of the height level of the tip of the probe needle.

In order to prevent the lower ends of the cantilever arms 6 or the connecting elements 5 from colliding with the semiconductor component to be tested or the wafer, a height difference 8 remains between the connecting elements 5 and the tip of the probe needle 2.

The pivoting center point 7, about which the tip of the probe needle 2 is displaced when a vertical force acts on a circularly arcuate movement path 9, is situated in the center of the articulated joint 5. On account of the downwardly extending cantilever arms 6 of the holder arm 1 and fastening arm 3, the articulated joint 5 is arranged beneath the horizontally arranged holder arm 1, with the result that the tangent to the movement path 9 of the tip remains virtually vertical during the yielding movement. As a result, the horizontal offset of the tip of the probe needle 2 is very small during the upward movement. However, since the pivoting center point 7 of the articulated joint 5 is not arranged at the same height level as the tip of the probe needle 2 but rather a height difference 8 remains between the pivoting center point 7 and the tip of the probe needle 2, the horizontal offset does not disappear completely. This small remaining horizontal offset ensures that the tip of the probe needle 2 penetrates an oxide layer which is possibly present in the contact area of the semiconductor component to be tested, thus ensuring reliable contact-connection.

The connecting elements 5 are in the form of strips and comprise a metallic material. In total, their flexural rigidity is lower than the flexural rigidity of the holder arm 1, with the result that they act as an articulated joint for the holder arm 1, the holder arm 1 being pivoted about the pivoting center point 7 of said articulated joint when a vertical force is loaded relative to the fastening arm 3. On account of the elastic properties of the connecting elements 5, the articulated joint generates a restoring force without any additional spring elements, said restoring force moving the holder arm 1 back into its initial position again when the load is removed. On account of the conductive properties of the metallic material of the connecting elements 5, the latter may be used, in a particularly advantageous manner, as parts of conductor tracks which are routed from the location at which the fastening arm 3 is in contact with the carrier device 4 to the probe needle 2.

The invention claimed is:

1. A probe holder for a probe needle, said holder being adapted, for fastening and electrical contact-connection, on a carrier device of a test apparatus and having a holder arm having a needle holder which is arranged at a free end of the holder arm to fasten the probe needle, and a fastening arm for connecting the holder arm to the carrier device, and wherein the holder arm and the fastening arm are connected to one another by a sole articulated joint such that a tip of the needle travels along an arcuate path about a pivot point on the joint in response to a vertical force.

2. The probe holder as claimed in claim 1, wherein the articulated joint comprises at least one flexurally soft solid element, one end of the element being connected to the holder arm and an other end of the element being connected to the fastening arm.

3. The probe holder as claimed in claim 1, wherein the articulated joint comprises at least one elongate connecting element, one end of the element being connected to the holder arm and an other end of the element being connected to the fastening arm.

4. The probe holder as claimed in claim 1, wherein at least one spring element for generating a restoring force is also provided on the articulated joint.

5. The probe holder as claimed in claim 1, wherein the articulated joint is arranged beneath the holder arm and the fastening arm.

6. The probe holder as claimed in claim 1, wherein the articulated joint is arranged at a vertical distance from the holder arm.

7. The probe holder as claimed in claim 6, wherein the vertical distance between the articulated joint and the holder arm corresponds approximately to a vertical distance between a tip of the probe needle and the holder arm.

8. The probe holder as claimed in claim 1, wherein the articulated joint comprises a metallic material.

9. The probe holder as claimed in claim 1, wherein the articulated joint comprises a polymer.

10. The probe holder as claimed in claim 9, wherein the polymer is electrically conductive.

11. The probe holder as claimed in claim 9, wherein the articulated joint has electrically conductive paths.

\* \* \* \* \*